US006946236B2

(12) United States Patent
Rottstegge et al.

(10) Patent No.: US 6,946,236 B2
(45) Date of Patent: Sep. 20, 2005

(54) NEGATIVE RESIST PROCESS WITH SIMULTANEOUS DEVELOPMENT AND AROMATIZATION OF RESIST STRUCTURES

(75) Inventors: Jörg Rottstegge, Erlangen (DE); Eberhard Kühn, Hemhofen (DE); Christian Eschbaumer, Schwaig (DE); Gertrud Falk, Erlangen (DE); Michael Sebald, Weisendorf (DE)

(73) Assignee: Infineon Technologies AG, Munich (DE)

( * ) Notice: Subject to any disclaimer, the term of this patent is extended or adjusted under 35 U.S.C. 154(b) by 138 days.

(21) Appl. No.: 10/186,648

(22) Filed: Jul. 1, 2002

(65) Prior Publication Data

US 2003/0073037 A1 Apr. 17, 2003

(30) Foreign Application Priority Data

Jun. 29, 2001  (DE) .......................................... 101 31 487

(51) Int. Cl.[7] .............................. G03F 7/20; G03F 7/30; G03F 7/32; G03F 7/38; G03F 7/004
(52) U.S. Cl. ...................... 430/296; 430/311; 430/313; 430/330; 430/270.1; 430/331
(58) Field of Search .............................. 430/296, 270.1, 430/311, 313, 315, 330, 331

(56) References Cited

U.S. PATENT DOCUMENTS

| 4,491,628 | A | * | 1/1985 | Ito et al. ...................... 430/176 |
| 5,173,393 | A | * | 12/1992 | Sezi et al. .................. 430/323 |
| 5,234,793 | A | * | 8/1993 | Sebald et al. ............... 430/323 |
| 5,234,794 | A | | 8/1993 | Sebald et al. |
| 6,136,499 | A | | 10/2000 | Goodall et al. |

FOREIGN PATENT DOCUMENTS

| EP | 0 395 917 B1 | 11/1990 |
| WO | WO 01/42860 | 6/2001 |

\* cited by examiner

*Primary Examiner*—Mark F. Huff
*Assistant Examiner*—John Ruggles
(74) *Attorney, Agent, or Firm*—Laurence A. Greenberg; Werner H. Stemer; Ralph E. Locher

(57) ABSTRACT

The invention relates to a process for producing amplified negative resist structures in which, following exposure and contrasting of the resist, the resist structure is simultaneously developed and aromatized. This substantially simplifies the production of amplified resist structures. Amplifying agents include compounds having not only a reactive group for attachment to an anchor group of the polymer, but also at least one aromatic group.

8 Claims, 1 Drawing Sheet

NEGATIVE RESIST PROCESS WITH SIMULTANEOUS DEVELOPMENT AND AROMATIZATION OF RESIST STRUCTURES

BACKGROUND OF THE INVENTION

Field of the Invention

The invention relates to a process for producing amplified negative resist structures.

In the fabrication of microchips, semiconductor substrates are structured (or patterned) using thin layers of photoresists. The chemical nature of the photoresists can be selectively altered by exposing them using a photomask or by direct irradiation, with an electron beam, for example. Following a developing step, in which either the exposed or the unexposed areas of the photoresist are removed, a structured photoresist is obtained which is used as a mask for etching the semiconductor substrate, for example. In the case of dry etching, the etching operation is usually performed with a fluorine or oxygen plasma. In order to selectively etch only the bare areas of the substrate, therefore, the mask-forming resist structure must possess sufficient resistance to the plasma that is used. When using an etching plasma containing oxygen, the photoresist therefore usually includes groups containing silicon. In the course of the etching operation, these groups are converted into silicon dioxide, which forms an etch-stable protective layer on the photoresist. The silicon atoms either may already be present in the photoresist polymer or may be introduced into the polymer subsequently, following the development of the resist structure, in a consolidation reaction. For this purpose, reactive groups are provided in the polymer. Such reactive groups include acid anhydride groups, carboxyl groups, or acidic phenolic hydroxyl groups, to which the amplifying agent, which carries a corresponding reactive group, an amino group for example, can be chemically attached.

In order to be able to realize low exposure doses and short exposure times when exposing the photoresist, photoresists known as chemically amplified resists (CARs) have been developed. In this case, the photoresist includes a photosensitive compound that on exposure, liberates a catalyst. In a subsequent amplifying step, the catalyst is able to bring about a chemical reaction that gives rise to a marked change in the chemical nature of the photoresist. With a single quantum of light, which liberates one catalyst molecule, it is therefore possible to bring about a multiplicity of chemical reactions and so to achieve a marked differentiation between the exposed and unexposed areas of the photoresist. The catalyst used is usually a strong acid, which is liberated by a photoacid generator, an onium compound for example. The polymer contains acid-labile groups, such as tertiary butyl groups, which are eliminated under the action of the strong acid liberated. The elimination of the acid-labile group is generally accompanied by the liberation of an acidic group: for example, a carboxyl group or an acidic phenolic hydroxyl group. This brings about a marked change in the polarity of the polymer, i.e., in its solubility in polar solvents. The polymer originally used in the photoresist, carrying acid-labile groups, is soluble in apolar solvents or solvent mixtures having a low polarity, such as alkanes, but also in alcohols, ketones or esters, whereas the polymer following the elimination of the acid-labile groups is soluble in polar solvents, generally water or basic, aqueous-organic developer solutions.

In connection with the production of resist structures, a range of processes have already been developed, which can be divided into two groups according to principles of operation.

In the case of positive photoresists, the exposed areas of the photoresist are detached in the developing step and in the structured photoresist, for example, form trenches, whereas the unexposed areas remain on the substrate and form, so to speak, the lines of the photoresist structure.

For producing positive photoresist structures, the procedure described above can be followed. As a result of the exposure, a chemical reaction is initiated within the photoresist, by means of which the photoresist polymer becomes soluble in alkaline developer solutions: for example, a 2.38% strength solution of tetramethylammonium hydroxide in water. On development, then, a corresponding positively structured photoresist is obtained.

In the case of negative resists, in contrast to the positive-working resists, the exposed portion of the resist remains on the substrate whereas the unexposed portion is removed by the developer solution. When working with chemically amplified negative resists, exposure initially likewise liberates a catalyst, usually a strong acid. The catalyst brings about, for instance, a crosslinking reaction in the photoresist, as a result of which the solubility of the polymer in the developer medium is reduced. As a result of the crosslinking, the exposed area becomes insoluble, whereas the unexposed area can be removed in appropriate developers. Developers used are generally aqueous solutions, so that the polymer usually has polar groups in the unexposed state.

For a modification of the developing step, a positive photoresist can also be used to produce a negative resist structure. A process of this kind is described, for example, in U.S. Pat. No. 4,491,628. There, a layer of a positive photoresist that is applied to a substrate is first of all exposed as described above, and an acid is liberated from a photoacid generator. In the subsequent amplifying step, the acid-labile groups in the exposed areas are eliminated by heating, so that the polymer is then in a polar form. In contradistinction to the positive developing process described above, an exposure is then carried out with an apolar solvent instead of with a polar aqueous developer. As a result, only the unexposed areas of the substrate, in which the polymer has retained its original apolar form, are detached. Since the polar fractions of the resist, in which polar groups—carboxylic acid groups, for example—have been produced by the exposure, are insoluble in apolar solvents, they remain as lines on the substrate.

Another negative photoresist includes not only a photobase, but also a thermoacid. A resist of this kind is described, for example, in Published PCT Patent Application PCT/DE00/04237. On exposure of the photoresist, a base is liberated in the exposed areas. In a subsequent amplifying step, an acid is liberated from the thermoacid generator by heating. In the exposed areas, the acid is neutralized by the base liberated beforehand and is therefore no longer available as a catalyst. In the unexposed areas, the acid catalyzes the elimination of the acid-labile groups from the polymer. Accordingly, in the unexposed areas, the polymer is converted from its apolar form into a polar form. In the subsequent developing step, therefore, the unexposed areas can be selectively detached from the substrate using an aqueous-alkaline developer, while the exposed areas remain, so to speak, as lines on the substrate.

As already mentioned, the resist structure must possess sufficient etch resistance when the substrate is etched. For this purpose, for instance, the lines of the resist structure must have a sufficient layer thickness. This is a particular problem in the case of resists for the 157 nm and the 13 nm technology, since at these wavelengths the photoresists known to date exhibit high absorption. Accordingly, only very thin polymer films can be used, in order to ensure that the radiation used for exposure is able to penetrate even into the deep areas of the resist in sufficient intensity, in order to be able to liberate sufficient quantities of catalyst. If insufficient quantities of catalyst are liberated in the lower layers of the photoresist, elimination of the acid-labile groups is incomplete, or in a worst case scenario, does not take place at all. A consequence of this is that following development, residues of the polymer remain in the trenches, forming what are known as resist feet. Because of its low layer thickness, the resistance of the structured photoresist to an etching plasma is insufficient, which is why its etch resistance must be increased. For this purpose, following development, the structured resist is chemically amplified. Where the resist structures have a sufficient layer thickness, it is also possible, in addition to an increase in layer thickness, to bring about a narrowing of the trenches, perpendicularly to the substrate surface, by laterally growing layers on the sidewalls of the trenches of the structured resist. As a result it is possible to achieve an improvement in resolution: that is, for example, the reproduction of narrower conductor tracks. A process of this kind is described, for example, in Issued European Patent Application EP 0 395 917 B1. In order to amplify the resist structure, the amplifying agent, in a solution in a suitable solvent or else from the gas phase, can be applied to the structured resist. The incorporation of silicon-containing amplifying agents into the polymer is generally referred to as silylation.

In a fluorine plasma, volatile silicon tetrafluoride is formed from the silicon that is present in the resist. In this case, amplifying the structured resist by means of silicon atoms makes no sense. In order to raise the resistance of the resist toward a fluorine plasma, therefore, the structured resist is amplified using aromatic amplifying agents.

In order to transfer structures produced with very short wavelength exposing radiation into a substrate, a resist system consisting of two layers has been used to date. The top layer of the resist system is comparatively thin and photostructurable. Following exposure, contrasting, and developing, the structured resist is amplified with a silicon-containing amplifying agent and the structure is transferred into the bottom layer of the resist system using an oxygen plasma. The bottom layer is composed, for example, of a resist which, although having a low etch resistance toward an oxygen plasma, possesses a high etch resistance toward a fluorine plasma. A resist of this kind includes polymers having a high aromatic fraction. An example is an etch-resistant novolac, a cresol resin. After the structure of the top, silylated resist layer has been transferred into the bottom resist layer with an oxygen plasma, the plasma is changed and the structure is transferred into the substrate using a fluorine plasma. The substrate in this case is composed, for example, of silicon, silicon nitride or silicon dioxide, so that the material of the substrate can be ablated by the conversion of the silicon-containing substrate into volatile silicon tetrafluoride. Because of the two-layer resist, the process is relatively expensive and technically complicated by the change of plasma system.

The existing processes for producing amplified resist structures involve a multiplicity of worksteps and are therefore very complicated to carry out. Every workstep also increases the error rate in the fabrication of microchips, meaning that a correspondingly high rejection rate must be tolerated. This is also a problem because of the fact that nondestructive testing is not possible at every step in microchip fabrication. Generally, error testing of this kind is possible only after several production steps, since it is only then that the electrical connections necessary for testing are present in the microchip. In some circumstances, therefore, several weeks may pass between a production step and error testing. Accordingly, every production step must exhibit an extremely low error rate.

Chemical consolidation requires corresponding reactive "anchor" groups in the polymer, to which the amplifying agent can be attached. Preparation of these polymers necessitates processes that are likewise complex, since, for example, they must be carried out in the absence of moisture in order to prevent premature hydrolysis of the reactive anchor groups.

SUMMARY OF THE INVENTION

It is accordingly an object of the invention to provide a process for producing an amplified negative resist structure which overcomes the above-mentioned disadvantages of the prior art processes of this general type.

In particular, it is an object of the invention to provide a process for producing an amplified negative resist structure, which is easy to carry out and which has a lower error rate as compared with the existing processes.

With the foregoing and other objects in view there is provided, in accordance with the invention, a process for producing an amplified negative resist structure. The process includes a step of providing a chemically amplified resist including: a polymer having acid-labile groups, which by action of an acid, are eliminated and liberate anchor groups, bringing about a change in a polarity of the polymer; a photoacid generator; and a solvent. The process also includes steps of: applying the chemically amplified resist to a substrate; removing the solvent to provide a photosensitive resist film; obtaining an exposed resist film by sectionally exposing the resist film to liberate an acid from the photoacid generator in exposed sections of the resist film; contrasting the exposed resist film such that the acid-labile groups of the polymer are eliminated by the acid, which has been liberated, and the anchor groups liberated in the exposed sections of the resist film; and after the contrasting, developing the exposed resist film, with a developer having a solvent in which the polymer, when in a state including the acid-labile groups, is soluble and in which the polymer, when in a state after the anchor groups have been liberated, is substantially insoluble or swellable. The solvent also includes an amplifying agent including at least one aromatic group and at least one reactive group that is able to coordinate to the anchor groups of the polymer. The process also includes a step of removing the excess developer.

In accordance with an added feature of the invention, the developer includes a swelling promoter that swells the polymer when in the state after the anchor groups have been liberated.

In accordance with an additional feature of the invention, the solvent of the developer is apolar.

In accordance with another feature of the invention, the solvent of the developer has a low polarity.

In accordance with a further feature of the invention, the polymer includes further reactive anchor groups that are able to form a bond with the reactive group of the amplifying agent.

In accordance with a further added feature of the invention, the amplifying agent includes at least two reactive groups.

In accordance with a further additional feature of the invention, the reactive group of the amplifying agent is a basic group.

In accordance with another added feature of the invention, the reactive group of the amplifying agent is a hydroxyl group, an amino group, a sulfonic acid group, a thiol group, a carboxyl group, a glycidyl ether, an anhydride group, an imide, an isocyanate group, a urethane, a ketene, or an epoxide.

In the inventive process, the resist structure is developed and is amplified with an aromatic amplifying agent in one conjoint step. As a result, in comparison to the existing processes, the development of the resist structure with a suitable developer medium in a separate workstep is omitted, together with the subsequent rinsing and drying step. As a result, there is a corresponding reduction in the error rate associated with the production of amplified structured resists. The process is easier to carry out than the processes used to date and therefore results in a reduction in costs. The process can be carried out using the photoresists customary for producing positive resist structures, and the common amplifying agents containing at least one aromatic group. These groups possess a delocalized π electron system and are therefore able to increase the resistance of the resist toward a plasma. Examples of suitable aromatic groups are aromatic groups such as a phenyl group, or fused aromatic groups, such as a naphthyl group. Another advantage of amplifying the resist with the inventive process is that no changeover of the plasma system is required when the structure is transferred into the substrate. Implementation of the inventive process for amplifying structured resists into existing production lines requires no special effort apart from a change in the solvent used for developing and amplifying.

Polymers which can be used for the photoresist are those which, following exposure and contrasting, liberate a reactive group which acts as an anchor group which is able to enter into reaction with the amplifying agent. The reaction may lead to the formation of a covalent bond between an anchor group and the amplifying agent. However, the amplifying agent may also be attached to the anchor group of the polymer by way of noncovalent bonds, e.g., ionic interactions or dipole-dipole interactions. The polymers must have adequate film-forming properties to be able to produce a uniform film of the photoresist on the substrate. Any polymer can be used which possesses, in the polymer chain or pendantly, acid-labile groups of low alkali solubility which generate reactive groups, such as acidic groups, on the polymer as a result of the catalytic effect of acid. Where appropriate, a simultaneous temperature treatment (contrasting) can be used. Examples of suitable acid-labile groups include tert-alkyl ester, tert-butoxycarbonyloxy, tetrahydrofuranyl, tetrahydropyranyl, tert-butyl ether, lactone or acetal groups. Tert-Butyl ester groups are particularly preferred. The polymer preferably contains groups which bring about increased transparency of the polymer (and hence of the resist layer) to light of very short wavelength, 157 nm for example, such as 1,1,1,3,3,3-hexafluoro-2-hydroxyisopropyl groups, for instance. The hydroxyl group is protected by a tert-butyl ether, tert-butoxycarbonyloxy, tetrahydrofuranyl, tetrahydropyranyl or acetal radical or by another acid-eliminable radical. Following the elimination of the protective group, the hydroxyl group can be used as a reactive group in the polymer, to which the amplifying agent can be attached.

The film-forming polymer may therefore be obtained by polymerization or copolymerization of corresponding monomers. Examples of suitable monomers include acrylates, methacrylates, maleic monoesters and diesters, itaconic monoesters and diesters, norbornenecarboxylic esters or else norbornenedicarboxylic monoesters and diesters. Corresponding repeating units of the polymer are depicted below. Y stands for an acid-labile group, one of the abovementioned groups for example, and $R^1$ stands for a non-acid-labile radical, an alkyl group having from 1 to 10 carbon atoms for example. Below, n stands for 0 or an integer, preferably between 1 and 10.

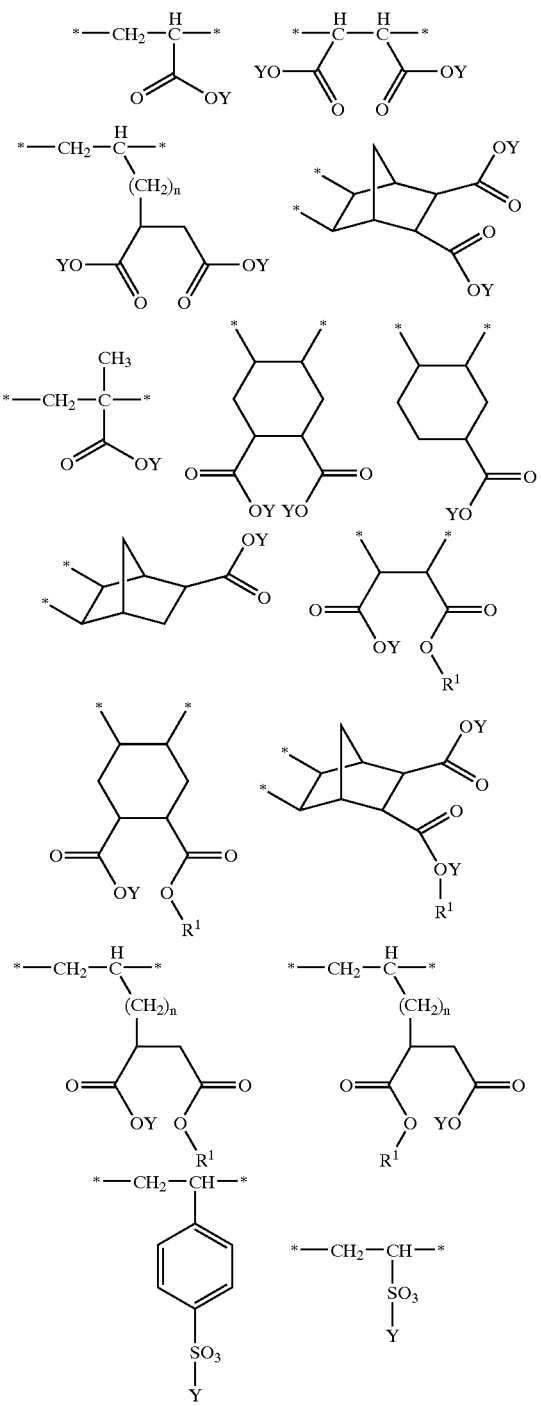

These monomers can be copolymerized with further monomers which may also already include aromatic groups. One suitable monomer, for example, is styrene. Besides the monomers mentioned, it is also possible to use other monomers customary for the preparation of polymers for photoresists.

As photoacid generators it is likewise possible to use the photoacid generators which are customary for photoresists. Preference is given to using onium compounds, as described, for example, in European Patent application EP 0 955 562 A1.

Resist solvents which can be used include, for example, methoxypropyl acetate, cyclopentanone, cyclohexanone, γ-butyrolactone, ethyl lactate, diethylene glycol dimethyl ether, or a mixture of at least two of these compounds. In general, however, all common solvents, or mixtures thereof, which are capable of taking up the resist components in a clear, homogeneous, and storage-stable solution can be used. This ensures a good layer quality when the substrate is coated.

The photoresist is applied to the substrate by the conventional techniques, such as by spincoating, spray application or dipping methods. The solvent is subsequently removed by conventional methods. For this purpose, generally speaking, the substrate with the resist film is heated.

Thereafter, the resist film is exposed, for which purpose again the conventional methods can be employed. Exposure may take place, for example, using a photomask or by direct exposure with focused electrons or ions. Exposure is preferably carried out with an exposing radiation having a wavelength in the range from 10 to 400 nm. In the exposed areas, the photoacid generator liberates an acid, so that a latent image of the desired structure is formed. Exposure of the resist film is followed by a contrasting step in which the latent image is intensified and is impressed into the polymer of the photoresist, so that the photoresist now has a chemical profile. For this purpose, the substrate with the exposed resist film is heated, generally at temperatures from 80 to 200° C. Under the catalytic effect of the acid, the acid-labile groups on the polymer are eliminated and the anchor groups for the attachment of the amplifying agent are liberated. The anchor groups generally have a high polarity, which is why the polymer now likewise has a high polarity and hence a high solubility in polar solvents or a low solubility in apolar solvents. The process of the invention then utilizes the difference in polarity of the polymer in the exposed and unexposed state, in other words its different solubility in the solvent. Where the polymer contains acid-labile ester groups in the unexposed state, then following exposure and contrasting, it contains carboxyl groups. The polymer in the unexposed state, therefore, is comparatively apolar and is soluble in apolar or weakly polar solvents, whereas the polymer following exposure and contrasting has a polar nature and is therefore insoluble in apolar or weakly polar solvents. This difference in solubility is then utilized in the developing step. The solvent is selected so that the polymer containing acid-labile groups is soluble and the polymer in which the anchor groups have been liberated is insoluble or swellable. As a result, in the developing step only the unexposed areas of the substrate are detached and in the unexposed areas structures are formed in which the substrate is bare. The developer further contains an amplifying agent which has at least one reactive group which is able to coordinate to the anchor groups of the polymer, and also contains at least one aromatic group. The amplifying agent may therefore be attached to the exposed areas of the photoresist as early as during the developing step, and may act there to increase the layer thickness and etch resistance of the resist. Coordination of the amplifying agent to the polymer preferably takes place by the formation of a chemical bond between the anchor groups of the polymer and the reactive group of the amplifying agent, accompanied, for example, by the formation of an amide bond. Also possible, however, is the formation of a salt and the coordination of polar groups. The amide bond may also be formed such that first of all, in the developing/amplifying step, an ammonium salt is formed by the anchor group and the amplifying agent and in a subsequent production step, e.g., during drying of the developed and amplified resist, heating is carried out, with an amide bond between the polymer and the amplifying agent being formed with elimination of water.

Solvents used for the developer include apolar or weakly polar solvents. All conventional aliphatic, cycloaliphatic, and aromatic solvents are suitable, such as alcohols, aldehydes, ketones, lactones or esters of low polarity, and also mixtures of the solvents. A preferred solvent is, for example, hexanol. The solvents must take up the components of the developer in an emulsion, or preferably in a clear, homogeneous, and storage-stable solution and must not react with the amplifying agent or with the anchor groups present on the polymer.

Following the development and amplification of the resist structure, the excess developer is removed with an appropriate solvent and the resist structure is dried.

In order to ensure a reaction rate that is sufficient for a practical application when attaching the amplifying agent to the polymer and to ensure a sufficient increase in layer thickness, the composition of the developer should be such that the resist is swollen by the developer in the exposed areas. This allows the amplifying agent to penetrate relatively deep layers of the resist structure, and so permits better amplification. Swelling of the resist in the exposed areas may be achieved simply by an appropriate choice of solvents. If, however, the exposed and contrasted resist exhibits only a very low solubility in the developer solvent, or if it is insoluble in the solvent, it is possible to admix to the developer, a swelling promoter that swells the polymer in which the anchor groups are liberated. Suitable swelling promoters include low molecular mass polar compounds, such as water, for instance, low molecular mass alcohols, e.g., methanol and ethanol, and low molecular mass aldehydes and ketones, such as acetone, for instance.

For the amplifying agent containing at least one aromatic group, it is possible to use any customary amplifying agents that contain aromatic groups, provided these agents possess sufficient reactivity toward the anchor groups of the polymer and do not react with the solvent of the developer. The amplifying agent ought to be able to diffuse into the polymer at a rate which is sufficient for a reaction in an industrial production process. The amplifying agent should therefore have a molecular weight in the range from 100 to 2,000 g/mol.

In order to allow the attachment of the aromatic amplifying agent to the anchor groups, preference is given to amplifying agents wherein the reactive group of the amplifying agent is a hydroxyl group, an amino group, a sulfonic acid group, a thiol group, a carboxyl group, a glycidyl ether, an anhydride group, an imide, an isocyanate group, a urethane, a ketene or an epoxide.

Since the anchor group of the polymer is usually an acidic group, such as a carboxyl group or an acidic hydroxyl group, such as a phenolic hydroxyl group, the reactive group of the amplifying agent is preferably a basic group. Particularly suitable in this context are amino groups, which are able to react, for example, with a carboxyl group to form an amide bond. Where hydroxyl groups are available in the polymer, isocyanate groups in the amplifying agent are highly suitable reactive groups.

Suitable amplifying agents are, for example, xylenes functionalized with a basic group, di(aminomethyl)

naphthalene, di(aminoethyl)naphthalene, di(aminopropyl) naphthalene, di(aminomethyl)benzene, and di(aminopropyl) benzene.

Further suitable basic aromatic amplifying agents are depicted below.

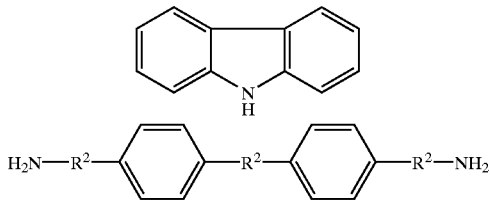

where $R^2$ can be an alkylene group having preferably from 1 to 10 carbon atoms or an arylene group having preferably from 6 to 20 carbon atoms.

In the inventive process, the polymer need not per se contain any more groups which serve as reaction anchors for consolidation of the resist structure. Such anchor groups are formed in the contrasting step on the acid-catalyzed elimination of the acid-labile groups following exposure, in the form, for instance, of acid groups or acidic alcoholic groups. This has the advantage that the polymers are much easier to process, since they contain no groups sensitive to hydrolysis.

Preferably, however, in addition to the anchor groups protected by an acid-labile group, the polymers include further reactive anchor groups which are able to react with the reactive group of the amplifying agent to form a covalent bond. By a reactive anchor group, it is meant a group, which without activation or deprotection beforehand, is able to react with an amplifying agent. The amplifying agent is attached to the resist polymer by a covalent bond. In this case, in the course of the amplifying step, there is an irreversible fixing of the amplifying agent on the polymer. Suitable for this purpose, in particular are acid anhydride groups provided in the polymer, which are introduced into the polymer by copolymerization of unsaturated carboxylic anhydrides. Examples of suitable monomers are maleic anhydride, itaconic anhydride or methacrylic anhydride. The anchor groups liberated by the elimination of the acid-labile groups have the further function, in the case of this variant of the process, of raising the polarity of the polymer and so lowering the solubility of the polymer in the solvent of the amplifying agent.

These reactive anchor groups may also be utilized for further modification of the photoresist. By way of example, the insolubility of the exposed areas in the developer can be increased further if further crosslinking of the polymer is brought about. This can be achieved, for example, when the amplifying agent contains at least two reactive groups. Compounds suitable for this purpose include, for example, the aromatic compounds, already mentioned above, which are functionalized by two amino groups.

The components described above are preferably used in the resist in the following proportions:

Film-forming polymer: 1–50% by weight, preferably 2–10% by weight;

Photoacid generator: 0.01–10% by weight, preferably 0.1–1% by weight; and

Solvent: 80–99% by weight, preferably 88–97% by weight.

The components described can be used in the developer in the following proportions:

Amplifying agent: 0.1–10% by weight, preferably 2–3% by weight;

Swelling promoter: 0.01–10% by weight, preferably 0.5–2% by weight; and

Solvent: 80–99% by weight, preferably 92–97% by weight.

Other features which are considered as characteristic for the invention are set forth in the appended claims.

Although the invention is illustrated and described herein as embodied in a negative resist process with simultaneous development and aromatization of resist structures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
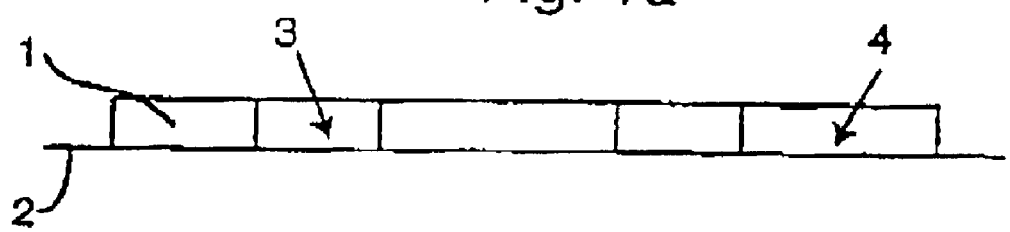
FIG. 1a diagramatically shows a cross section through a photoresist following exposure and contrasting.
Figure 1B:
FIG. 1b diagramatically shows a cross section through a photoresist following chemical consolidation.

In order to implement the process of the invention, first of all, a resist 1 is applied to a substrate 2. The resist includes a polymer containing polar groups which are protected with an acid-labile group. The substrate 2 may be, for example, a silicon wafer or a layer of silicon dioxide or silicon nitride applied to the silicon wafer. Application takes place by the customary techniques, such as by spin coating. Thereafter, the resist film is dried and then exposed. There is, for example, a photomask arranged in the beam path in order to image the desired structure on the resist film. Since the photoresist contains a photoacid generator, an acid is liberated in the exposed areas 3 which forms a latent image of the structure. In the unexposed areas 4, no acid is liberated. In the contrasting step, which is accompanied by heating, in the exposed areas 3 the acid-labile groups on the polymer are eliminated under the action of the liberated acid, and the polar groups are liberated on the polymer. In the exposed areas 3, therefore, the polymer is polar and insoluble in apolar solvents, whereas in the unexposed areas 4 it is apolar and hence soluble in apolar solvents. In the developing amplifying step, the unexposed areas 4 are detached from the substrate 2, while in the exposed areas 3 the resist remains on the substrate 2. The amplifying agent has deposited itself on the outside of the structure 5 to form an amplifying section 6. The amplifying agent has undergone partial diffusion into the exposed areas 3 of the resist, so that the amplifying area 6 also extends over sections of the exposed area 3.

We claim:

1. A process for producing an amplified negative resist structure, which comprises:

providing a chemically amplified resist including:
a polymer including acid-labile groups, which by action of an acid, are eliminated and liberate anchor groups, bringing about a change in a polarity of the polymer,
a photoacid generator, and
a Solvent;

applying the chemically amplified resist to a substrate;

removing the solvent to provide a photosensitive resist film;

obtaining an exposed resist film by sectionally exposing the photosensitive resist film to liberate an acid from the photoacid generator in exposed sections of the photosensitive resist film;

contrasting the exposed resist film such that the acid-labile groups of the polymer are eliminated by the acid, which has been liberated, and the anchor groups are liberated in the exposed sections of the resist film;

after the contrasting, developing the exposed resist film, with a developer including:
- a solvent in which the polymer, when in a state including the acid-labile groups, is soluble and in which the polymer, when in a state after the anchor groups have been liberated, is substantially insoluble or swellable, and
- an amplifying agent including at least one aromatic group and at least one reactive group that is able to coordinate to the anchor groups of the polymer; and removing excess developer, thereby producing a chemically amplified negative resist structure on the substrate.

2. The process according to claim 1, wherein the developer includes a swelling promoter that swells the polymer when in the state after the anchor groups have been liberated.

3. The process according to claim 1, wherein the solvent of the developer is apolar.

4. The process according to claim 1, wherein the solvent of the developer has a low polarity.

5. The process according to claim 1, wherein the polymer includes reactive anchor groups that are able to form a bond with the reactive group of the amplifying agent.

6. The process according to claim 1, wherein the amplifying agent includes at least two reactive groups.

7. The process according to claim 1, wherein the reactive group of the amplifying agent is a basic group.

8. The process according to claim 1, wherein the reactive group of the amplifying agent is selected from a group consisting of a hydroxyl group, an amino group, a sulfonic acid group, a thiol group, a carboxyl group, a glycidyl ether, an anhydride group, an imide, an isocyanate group, a urethane, a ketene, and an epoxide.

* * * * *